US006998220B2

(12) United States Patent
Werner et al.

(10) Patent No.: US 6,998,220 B2
(45) Date of Patent: Feb. 14, 2006

(54) METHOD FOR THE PRODUCTION OF THIN LAYER CHIP RESISTORS

(75) Inventors: Wolfgang Werner, Heide (DE); Horst Wolf, Heide (DE); Reiner Wilhelm Kuehl, Heide (DE)

(73) Assignee: BC Components Holdings B.V., B.J. Eindhoven (NL)

( * ) Notice: Subject to any disclaimer, the term of this patent is extended or adjusted under 35 U.S.C. 154(b) by 105 days.

(21) Appl. No.: 10/469,214

(22) PCT Filed: Feb. 19, 2002

(86) PCT No.: PCT/EP02/01730

§ 371 (c)(1),
(2), (4) Date: Aug. 26, 2003

(87) PCT Pub. No.: WO02/071419

PCT Pub. Date: Sep. 12, 2002

(65) Prior Publication Data

US 2004/0126704 A1 Jul. 1, 2004

(30) Foreign Application Priority Data

Mar. 2, 2001 (DE) ................................ 101 10 179

(51) Int. Cl.
*H01L 21/02* (2006.01)

(52) U.S. Cl. ...................... 430/311; 430/319; 430/322; 430/945; 216/16; 216/65; 216/66; 438/382; 438/940

(58) Field of Classification Search ................ 430/311, 430/319, 322, 945; 216/16, 65, 66; 438/382, 438/940

See application file for complete search history.

(56) References Cited

U.S. PATENT DOCUMENTS

| | | | | |
|---|---|---|---|---|
| 3,699,649 | A | 10/1972 | McWilliams | |
| 4,468,414 | A | 8/1984 | Van Vonno | |
| 4,594,265 | A | 6/1986 | Van Vonno et al. | |
| 6,004,734 | A | 12/1999 | Berg | |
| 6,322,711 | B1 * | 11/2001 | Chen ........................... | 216/16 |
| 6,365,483 | B1 | 4/2002 | Lin et al. | |

FOREIGN PATENT DOCUMENTS

| | | |
|---|---|---|
| DE | 44 29 794 C1 | 2/1996 |
| EP | 1 374 257 B1 | 9/2004 |
| JP | 04178503 | 6/1992 |

* cited by examiner

*Primary Examiner*—John A. McPherson
*Assistant Examiner*—Daborah Chacko-Davis
(74) *Attorney, Agent, or Firm*—Kelly, Lowry & Kelley, LLP

(57) ABSTRACT

A method for manufacturing thin-film chip resistors, in which method a resistor layer (14) and a contact layer (15, 16) are applied onto the upper surface of a substrate (10) and structured using laser light so as to form on said substrate (10) a plurality of adjacent, separate resistor lands (24) having a predetermined approximate resistance value, allows the simplified and cheap manufacturing by performing the electrical insulation of the resistor elements (24) and the structuring of the individual resistor lands (24) for the entire resistor land simultaneously by means of a laser-lithographic direct exposure method.

11 Claims, 4 Drawing Sheets

METHOD FOR THE PRODUCTION OF THIN LAYER CHIP RESISTORS

TECHNICAL FIELD

The present invention relates to the field of manufacturing passive electronic components. It is directed to a method for manufacturing thin-film chip resistors according to the specification set forth in claim 1.

Such a method is known, for example, from U.S. Pat. No. 5,978,392.

PRIOR ART

Methods for manufacturing thick-film resistors wherein the resistor and contact layers are applied as paste patterns by screen printing are generally known. In this manner, it is possible to manufacture very cheap components.

Methods for manufacturing thin-film resistors or thin-film chip resistors are also known wherein the resistor and contact layers are applied by sputtering/vacuum evaporation and subsequently are structured in a photolithographic process step. Components manufactured in this way normally are of a higher quality with the drawback of higher manufacturing cost.

The aforementioned U.S. Pat. No. 5,976,392 describes the manufacturing of a thin-film resistor comprising thick-film contacts attached to it which is not manufactured in a photolithographic structuring process but in which etching by means of a focussed high-energy beam is used to structure the resistor lands. In particular, a laser beam having a width of 30 to 200 μm is used to determine the contour of the resistor land "in writing" by appropriately displacing the beam in the substrate level within the regions of the individual resistors which may have a width of 0.4 to 3.5 mm and a length of 0.8 to 6.5 mm. The elimination of photolithography and the utilisation of thick-film contacts may help to reduce the cost, but implies the disadvantage of more time-consuming successive processing of the individual resistors and/or resistor lands.

Another patent (DE-A1-199 01 540) describes the fine adjustment of thin resistor films wherein a focussed laser beam, e.g. an argon laser, is used for "writing". A method for forming a laser pattern of conductor strips is known from DE-C1-38 43 230. Here, direct structuring of metal films on plastic material to be used as printed boards is suggested.

DESCRIPTION OF THE INVENTION

It is an object of the present invention to provide a method for manufacturing thin-film chip resistors which provides a high precision of the resistors produced and at the same time simplifies and accelerates the production to reduce the manufacturing cost.

This object is achieved by the entirety of characteristics set forth in claim 1. The crux of the invention is to use a laser-lithographic direct exposure process wherein one or several complete resistors are structured by a single exposure (a "laser shot") through an appropriately structured mask covering the entire region of resistors in order to form the lands of the individual resistors.

The invention allows to manufacture extremely cheap thin-film chip resistors benefiting from the advantages of a lithographic technology with the structuring being performed directly and, in contrast to photolithography, in a single process step. Compared with the aforementioned U.S. Pat. No. 5,978,392, the invention allows a faster and hence cheaper manufacturing of chip components because the structure is not "written" by a focussed laser beam but formed by a direct exposure of a whole or even several whole components using one or several laser shots.

A preferred embodiment of the method according to the present invention is characterised by the fact that a UV laser (e.g. an excimer laser) having wavelengths ranging from 150 nm to 400 nm in the beam path of which a mask corresponding with the structure to be formed is inserted is used, and that in the present case an excimer laser emits laser beams at wavelengths ranging from 248 nm to 351 nm. At sufficient power, the laser irradiation directly removes the metallic thin film of the resistor layer at the exposed locations or transforms it into a non-conductive oxide.

In this process, it is especially useful that a substrate is used which is subdivided into individual regions by structuring means, preferably notches, but also laser grooves, that the structuring means comprise a plurality of structuring notches in the surface of the substrate extending perpendicularly relative to each other and forming a grid, and that after having completed the manufacture of the individual thin-film chip resistors the substrate is cut along the notches into individual thin-film chip resistors. The structuring, e.g. by laser grooves, may also be performed during the manufacturing process, i.e. following the application of the thin films.

Another preferred embodiment of the method according to the invention is characterised by the fact that prior to structuring the resistor layer into individual resistor lands, local contact layers for every thin-film chip resistor are applied as islands or as a continuous strip onto the resistor layer in the end portions of the resistor lands to be manufactured. In this respect, the thin-film technology (e.g. masked vacuum evaporation) is preferred. Thick-film techniques or combinations of both are also possible. The sequence of manufacturing processes (resistor layer, contact layer) may also be reversed.

Further embodiments are provided in the dependent claims.

SHORT DESCRIPTION OF THE FIGURES

Now the invention is explained in greater detail with a view to example embodiments with reference to the accompanying drawings in which:

FIG. 2 shows a longitudinal section of the substrate of FIG. 1;

FIG. 3 shows the substrate of FIG. 2 provided with a resistor layer applied to the entire surface;

FIG. 4 shows the coated substrate of FIG. 3 with local or continuous contact layers applied onto the upper and lower surfaces;

FIG. 5 shows the laser-lithographic direct exposure process for structuring the resistor lands of the individual resistors;

FIG. 6 shows the subsequent fine adjustment of the resistor lands;

FIG. 7 shows in an illustration comparable with FIG. 1 the substrate comprising an exemplary, completely structured chip resistor;

WAYS TO IMPLEMENTING THE INVENTION

Figure 1:
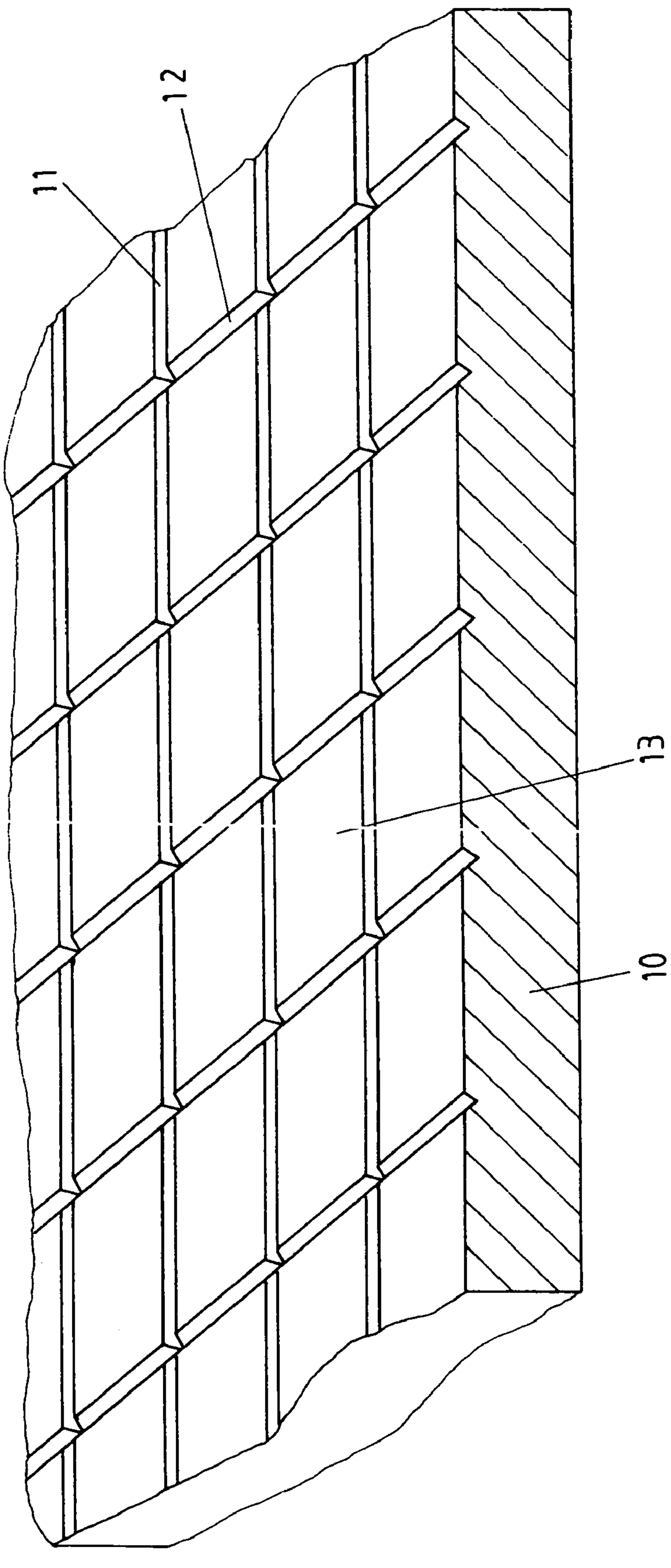
FIG. 1 shows a perspective, partially sectional view of a pre-notched, laser-grooved or sawed substrate to be preferably used in the manufacturing method according to the present invention.

FIG. 1 shows in a perspective, partially cross-sectional view of a pre-notched or laser-grooved or sawed substrate 10 preferably used in the manufacturing method according to the invention. Preferably, substrate 10 is made of a glass, silicon, SiO or an insulating ceramic material such as $Al_2O_3$ or AlN. It is subdivided on its upper surface by grid-like notches 11, 12 extending perpendicularly relative to each other into individual regions 13 in each of which a thin-film chip resistor is to be formed. Substrate 10 may also be provided sawed or laser-grooved or without any subdivision. Depending upon the subdivision, resistor arrays or resistor networks may be formed as well.

Figure 2:
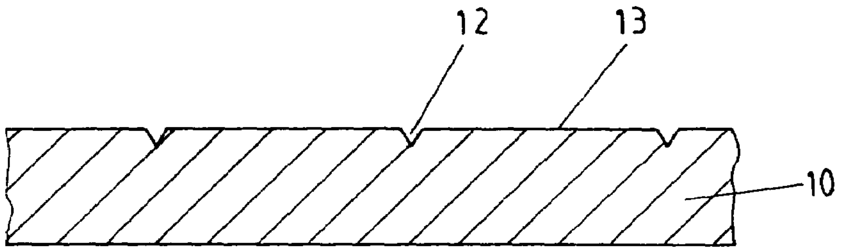
FIGS. 2–7 show various steps for manufacturing thin-film chip resistors in a preferred example embodiment of the present invention, in particular
Figure 3:
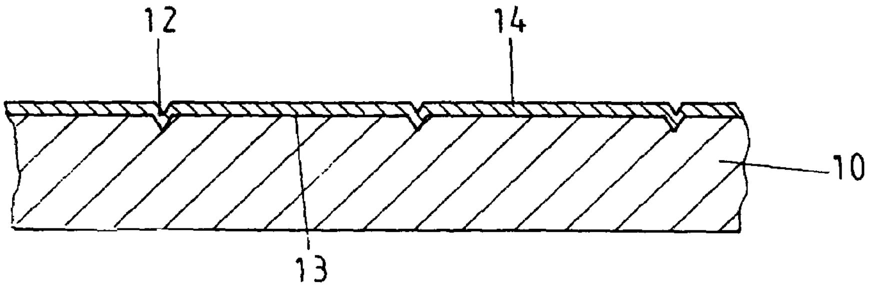

Firstly, according to FIG. 3 a resistor layer 14 is applied, preferably covering the entire surface, onto the substrate 10, which is once more illustrated in the longitudinal sectional view of FIG. 2. Said resistor layer 14 is typically a metal layer made of a suitable resistor alloy such as CrNi, CrSi, TaN, CuNi. Said resistor layer is preferably applied by sputtering or vacuum evaporation. Germination, e.g. by Pd, for later metallisation is also possible. Further, it is possible to perform a masked coating, rather than a coating covering the entire surface, in order to form electrically insulated resistor layers for instance in adjacent regions 13. Several resistor layers formed one on top of the other are also possible.

Figure 4:
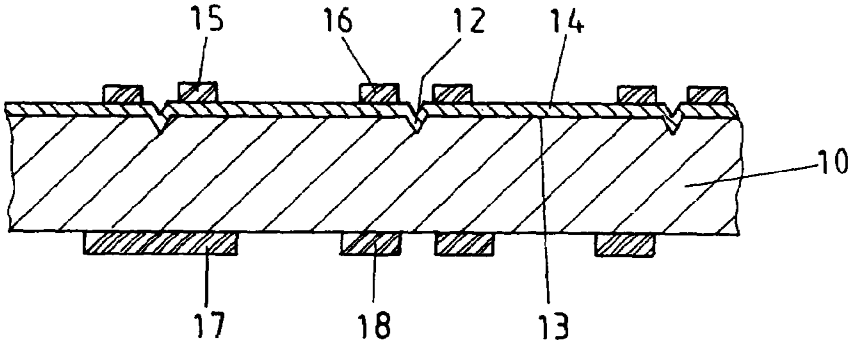

After having applied the resistor layer of the desired composition and thickness or resistance value, local contact layers 15, 16 and 17, 18 are applied onto the resistor layer 14 and the upper surface of substrate 10, respectively, and, if necessary, onto the lower surface of substrate 10. For each of the regions 13, a pair of contact layers 15, 16 spaced apart from one another is used between which the resistor land (referenced by 24 in FIG. 7) extends which is to be structured thereafter. The contact regions 17, 18 on the lower surface are later electrically connected to the corresponding contact regions 15, 16 on the upper surface and serve as contacts of the SMD components used as chip resistors. The contact regions 17, 18 may also be formed as continuous strips as suggested in FIG. 4 as reference numeral 17. Preferably, the contact layers 15, 16 are applied using a thin-film method, and the contact layers 17, 18 using a thick-film method. Other combinations (only thin-film, only thick-film, thin-film on the lower surface, thick-film on the upper surface) are also possible. In the preferred manufacturing sequence, the contact layer is applied onto the resistor layer, i.e. in a subsequent process step. It is also possible to apply the contact layer beneath the resistor layer, i.e. in a preceding process step. In particular, the first process step may comprise the application of the lower contact layer 17, 18.

Figure 5:
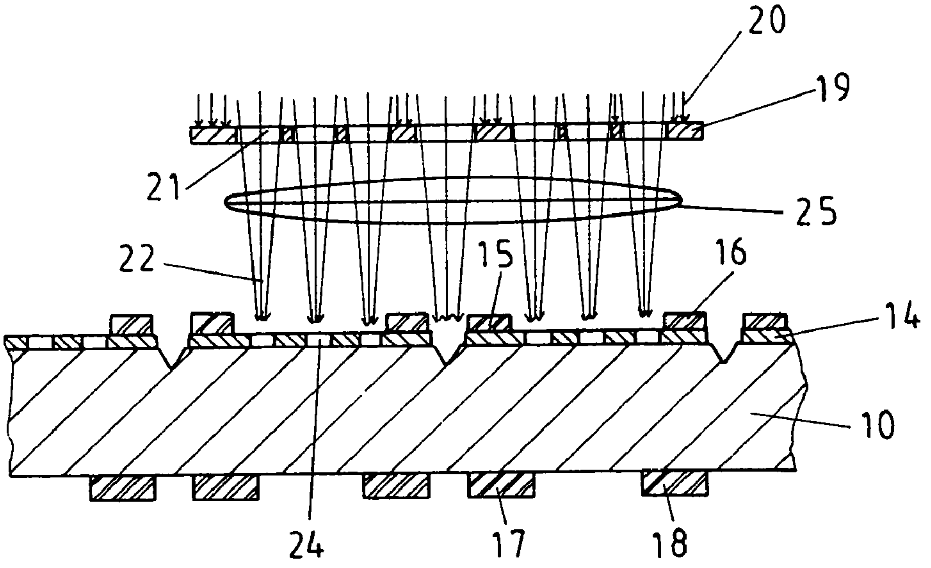
Figure 7:
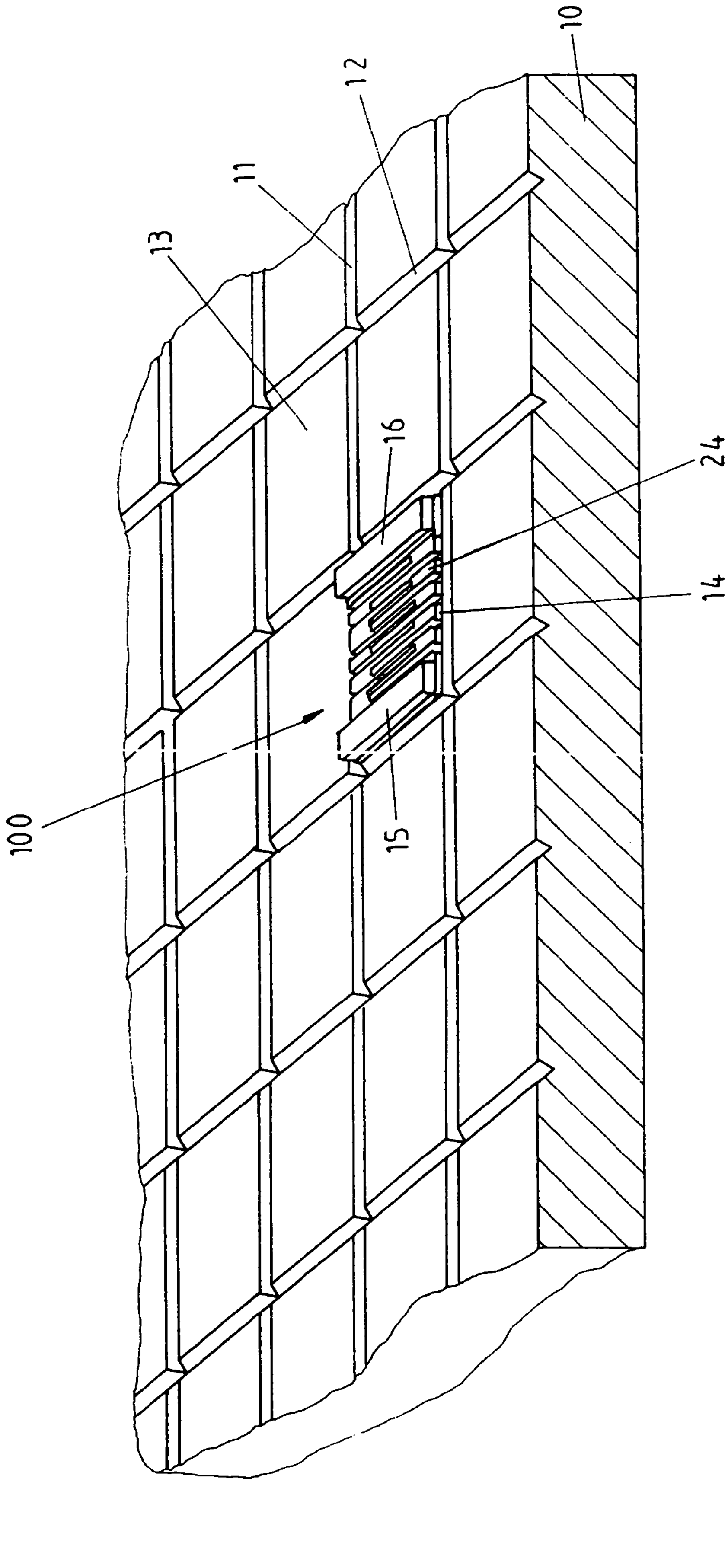

The structuring itself of the resistor layer 14 to form one resistor land per region 13 is performed according to FIG. 5 by a laser-lithographic exposure technique. In this technique, a flat laser beam 20 having a beam cross-section of up to 20×30 $mm^2$ is converted by a suitably structured mask 19 positioned in the beam path into a masked laser beam 21 which impinges on the resistor layer 14 on an area being at least equal in size with the optical image of the resistor land to be structured. The mask 19 is provided with mask apertures 21 in those regions in which the material of the resistor layer 14 is removed or converted into a non-conductive state by oxidation. One or several "laser shots" in an image area of up to several $mm^2$ are used to structure the resistor lands of one resistor or several adjacent resistors (two in the example shown in FIG. 5) by a non-writing method. At the same time, the mask 19 is designed so as to expose the resistor layer 14 in the region of the notches 11, 12, too, so that in case of the existence of a surface-covering resistor layer 14 an electrical insulation of the individual regions 13 is provided simultaneously. The structuring process results in a thin-film chip resistor 100 as shown in FIG. 7 as an example for one of the regions 13.

Figure 6:
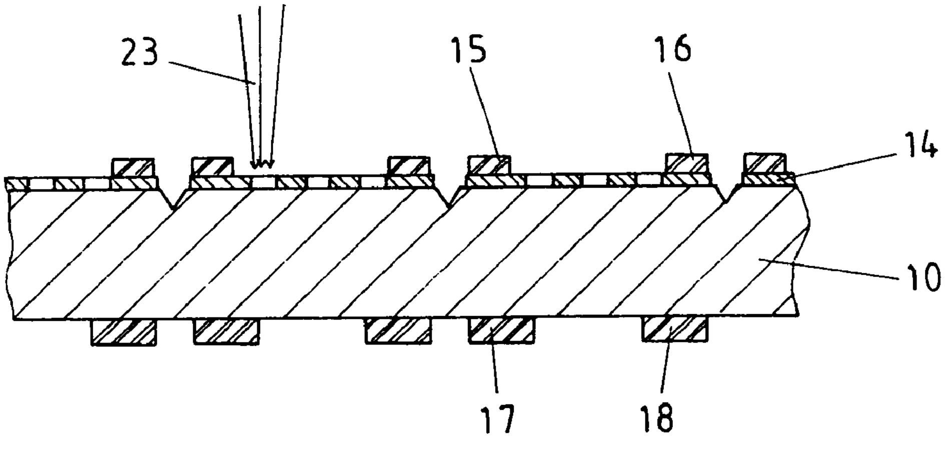

After having structured all resistor lands in the desired manner by direct exposure, the fine adjustment required for providing the enhanced precision of the resistance value is performed according to FIG. 6, preferably by treating the resistor land with a (writing) laser beam 23 in a conventional method.

Finally, the various thin-film chip resistors 100', 100" may be separated by breaking apart the substrate 10 along the separation lines 28 determined by the notches 11, 12. Depending upon the design of the separation lines, coherent resistor arrays or resistor networks may be generated in this manner.

As a whole, the present invention allows, at extremely low cost, the manufacturing of thin-film chip resistors using the advantages of a lithographic technique, wherein the structuring including the electrical insulation of the individual elements is not performed by writing with a focussed laser beam but as direct exposure of one or even several whole components by one laser shot, i.e. contrary to photolithography in a single process step.

LIST OF REFERENCE NUMERALS

10 substrate
12, 12 notch
13 region
14 thin-film resistor layer (e.g. metal alloy)
15, 16 contact layer (upper surface)
17, 18 contact layer (lower surface)
19, 26 mask
20 laser beam (unmasked)
21, 27 mask aperture
22 laser beam (masked)
23 laser beam
24 resistor land (e.g. meander)
25 optical imaging system
100, 100', 100" thin-film chip resistor

What is claimed is:

1. A method for manufacturing thin-film chip resistors (100,100',100") wherein a resistor layer (14) and a contact layer (15, 16) are applied onto the upper surface of a substrate (10) and structured by means of laser light so as to form on said substrate (10) a plurality of adjacent, separate resistor lands (24) having a predetermined approximate resistance value, characterised in that the electrical insulation of resistor elements (13) and the structuring of said individual resistor lands (24) are performed simultaneously for the entire resistor land using a laser-lithographic direct exposure method.

2. A method according to claim 1, characterised in that several, in particular adjacent, resistor elements (13) are simultaneously electrically insulated and structured by one or several exposures, and that during the laser-lithographic direct exposure, in addition to structuring said resistor lands (24), the resistor lands (24) of adjacent thin-film chip resistors are simultaneously electrically insulated from one another.

3. A method according to claim 2, characterised in that for the laser-lithographic direct exposure a UV laser is used into the beam path of which a mask (19) corresponding to the structure of said resistor lands (24) to be formed is inserted and optically (25) depicted on the substrate surface.

4. A method according to claim 3, characterised in that, for example, an excimer laser emits laser beams (20) having wavelengths ranging from 150 nm to 400 nm.

5. A method according to claim 4, characterised in that a substrate (10) is used which is subdivided by structuring means (11, 12) into individual regions (13), and that in each of said regions (13) one thin-film chip resistor (100, 100', 100") is formed.

6. A method according to claim 5, characterised in that said structuring means (notches, laser scribes, laser grooves, saws) comprise a plurality of notches (11, 12) extending perpendicularly relative to each other and forming a grid in the surface of said substrate (10), and that after completion of the manufacturing of said thin-film chip resistors (100, 100', 100") said substrate (10) is broken into separate thin-film chip resistors (100,100',100") along said notches (11,12) or into coherent resistor arrays or resistor networks.

7. A method according to claim 6, characterised in that prior to structuring said resistor layer (14) to form individual resistor lands (24), local contact layers (15, 16) for each of said thin-film chip resistors (100, 100', 100") to be formed are applied onto said resistor layer (14) on the end portions of said resistor lands (24) to be formed.

8. A method according to claim 7, characterised in that, in addition to said contact layers (15, 16) on the resistor layer (14), further local contact layers or contact strips (17,18) are applied onto the lower surface of said substrate (10).

9. (currently amended) A method according to claim 8, characterised in that said contact layers (15, 16) on the upper surface are preferably formed by a thin-film method (sputtering or vacuum evaporation) while said contact layers (17, 18) are applied onto a lower surface preferably by a thick-film method.

10. A method according to claim 9, characterised in that following the structuring of said resistor lands (24) using the laser-lithographic direct exposure method, a fine adjustment of said resistor lands (24) is performed.

11. A method according to claim 10, characterised in that said fine adjustment is performed using a laser beam (23).

* * * * *